(12) United States Patent
Smith et al.

(10) Patent No.: US 7,135,205 B2
(45) Date of Patent: Nov. 14, 2006

(54) FUEL CELL MEMBRANES AND CATALYTIC LAYERS

(75) Inventors: Paul L. Smith, Roswell, GA (US); Peter W. Faguy, Rochester Hills, MI (US); Andrew T. Hunt, Atlanta, GA (US); Charles McKendrie Quillian, V, Stone Mountain, GA (US); William John Dalzell, Jr., Parrish, FL (US); Frank C. Witbrod, Cumming, GA (US); Stein S. Lee, Boca Raton, FL (US); William Harm, Gainesville, GA (US); Joanne Yardlyne Smalley, Riverdale, GA (US); Mark Batich, Roswell, GA (US); William Hoos, Atlanta, GA (US)

(73) Assignee: nGimat, Co., Atlanta, GA (US)

( * ) Notice: Subject to any disclaimer, the term of this patent is extended or adjusted under 35 U.S.C. 154(b) by 0 days.

(21) Appl. No.: 10/506,412

(22) PCT Filed: Feb. 28, 2003

(86) PCT No.: PCT/US03/06121

§ 371 (c)(1),
(2), (4) Date: Jul. 25, 2005

(87) PCT Pub. No.: WO03/074195

PCT Pub. Date: Sep. 12, 2003

(65) Prior Publication Data

US 2006/0177572 A1    Aug. 10, 2006

(51) Int. Cl.
*B05D 1/02* (2006.01)
*B05D 1/34* (2006.01)
*B05B 7/26* (2006.01)

(52) U.S. Cl. ............... 427/201; 427/422; 427/426; 427/427.4; 118/310; 118/313

(58) Field of Classification Search ............... 427/201, 427/422, 426, 427.4; 118/310, 313
See application file for complete search history.

(56) References Cited

U.S. PATENT DOCUMENTS

| | | | | |
|---|---|---|---|---|
| 3,857,737 | A | * 12/1974 | Kemp et al. | ............. 252/182.1 |
| 4,177,159 | A | * 12/1979 | Singer | ........................ 502/101 |
| 6,132,653 | A | * 10/2000 | Hunt et al. | .................... 264/5 |

FOREIGN PATENT DOCUMENTS

| | | |
|---|---|---|
| JP | 2003-001024 | 1/2003 |
| KR | 2002-0010436 | 2/2002 |
| KR | 2002-0054749 | 7/2002 |

OTHER PUBLICATIONS

English language abstract of Korean Publication No. 2002-0010436.
English language abstract of Korean Publication No. 2002-0054749.
English language abstract of Japanese Publication No. 2003-001024.

* cited by examiner

Primary Examiner—Fred J. Parker
(74) Attorney, Agent, or Firm—Wayne E. Nacker; Alfred H. Muratori

(57) ABSTRACT

To form an ionomer-based catalytic layer on a porous substrate, a heat source (40) is used to dry an ionomer-containing spray (46) so that it does not substantially liquid flow on the substrate (14). The ionomer spray (46) may contain a catalyst. A spray (46) of mixed material for forming the catalytic layer is entrained by a gas stream and is heated and directed to a substrate surface (12). For hydrogen/oxygen fuel cells, catalytic material is incorporated into the proton-conducting membrane (56) to convert diffusing oxygen and hydrogen to water to reduce potential loss at the electrodes and maintain hydration of the proton-conducting membrane (56).

10 Claims, 4 Drawing Sheets

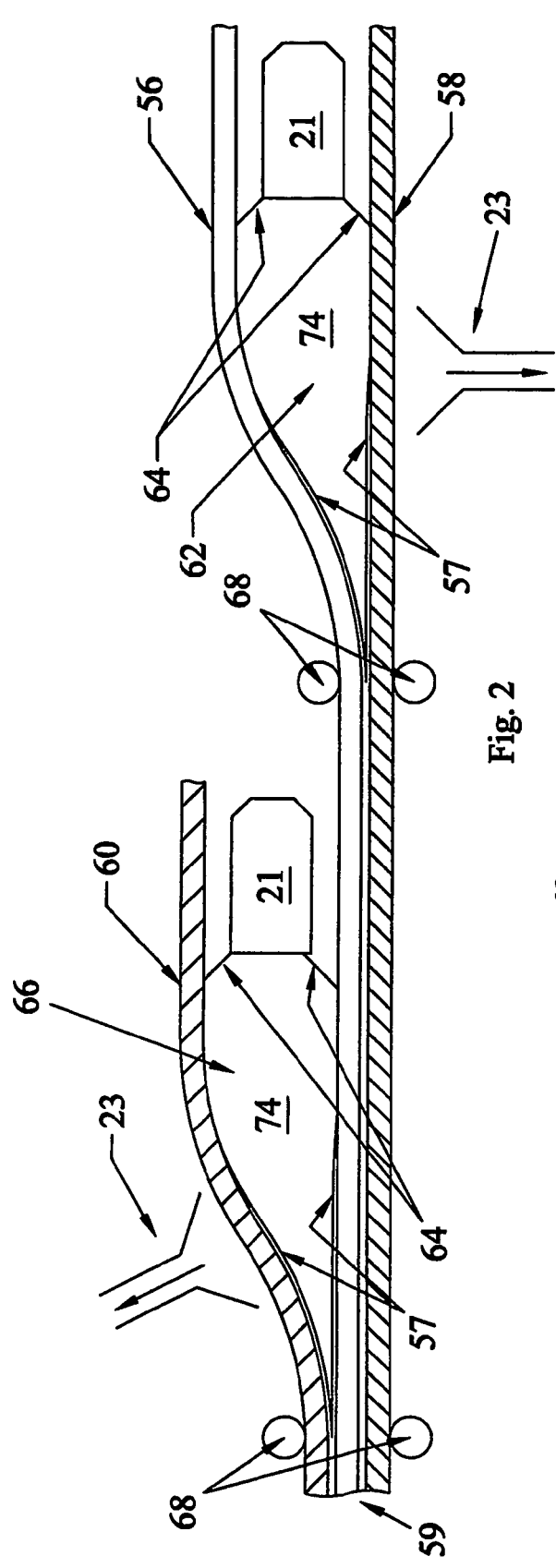
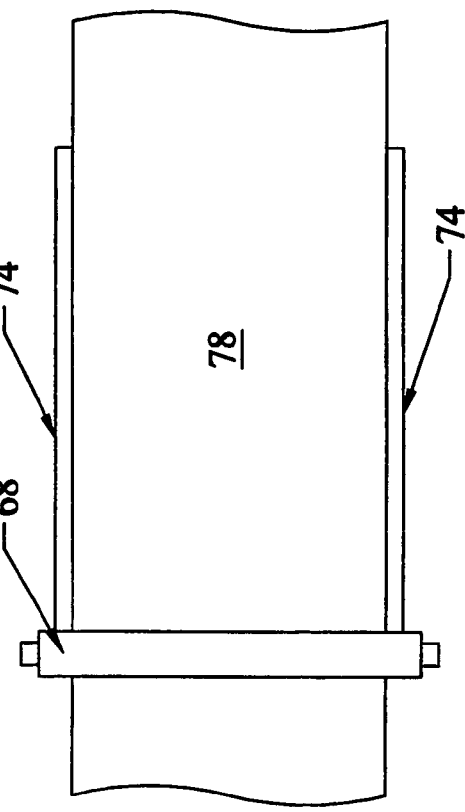
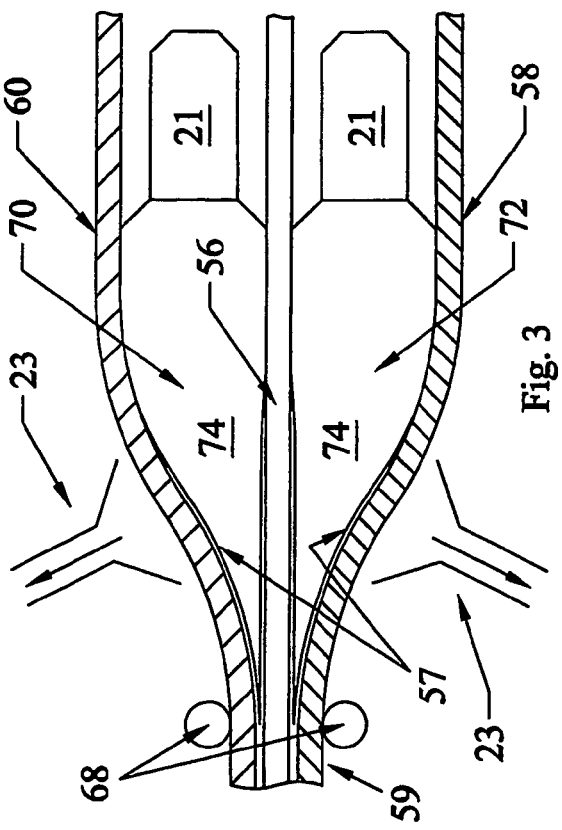

FUEL CELL MEMBRANES AND CATALYTIC LAYERS

The invention is directed to methods and apparatus for producing catalytic layers, such as those used in the cathodes and anodes of fuel cells, and fuel cells having proton-conducting membranes that provide enhanced properties.

BACKGROUND OF THE INVENTION

Catalytic layers for fuel cells are well known which comprise an ionomer, e.g., persulfonated polytetrafluoroethylene, such as that sold as NAFION®; conductive particulates, typically carbon; and catalyst that is typically supported by the conductive particulates. Catalytic materials include very fine particles of catalytic metals, such as platinum, gold, ruthenium, palladium, and combinations of such materials. For a fuel cell that uses hydrogen or a hydrocarbon as the fuel and oxygen as the oxidant, the cathodic catalytic layer typically uses platinum as the catalyst and the anodic catalytic layer typically uses a platinum/ruthenium mixture as the catalyst. Typically, the carbon particulates have mean particulate diameters of between 20 and 2000 nanometers; while the catalytic particulates supported by the carbon particulates typically have mean particulate diameters of between 2 and 20 nanometers. Catalytic layers may also employ particulates of a hydrophobic material, such as polytetrafluoroethylene (PTFE, such as that sold as TEFLON®) for water management.

Because fuel cells run on gases, it is implicit that the catalytic layers of fuel cells have sufficient porosity to be permeable to gases. The pore sizes should be large enough to allow passage of the gas into the layer, but sufficiently small such that substantially all of the gas contacts a catalytic surface in its passage through the layer so as to chemically react and produce electrons or create an electron deficit, as the case may be.

A prior art method of providing a catalytic layer is to produce a fluid composition, e.g., a solution/suspension, of the layer components, e.g., carbon-supported catalyst dispersed in a solution/suspension of NAFION® (persulfonated polytetrafluoroethylene); apply, e.g., with doctor blades, this fluid to a substrate surface, e.g., the surface of a woven or non-woven carbon cloth; and subsequently dry the fluid to produce the catalytic layer. The surface of the substrate, which comprises a carbon cloth, has an uneven surface. When a layer is formed from a solution and a doctor blade is used in application of the solution, the surface of the catalytic layer away from the substrate is substantially smooth. As the surface of the catalytic layer that contacts the uneven substrate is similarly uneven, the catalytic layer that is formed is of uneven thickness. All portions of the catalytic layer must be sufficiently thick to ensure that substantially all of the gas passing through the layer comes into contact with catalyst. This means that portions of the layer are thicker than is required. As a result, catalytic material, including expensive catalytic metal, is used in excess if applied by this method. Furthermore, thicker portions of a catalytic membrane are less efficient in transporting electrons and in transporting chemicals, such as water, that must be removed from the layer.

U.S. Pat. No. 5,861,222 describes a method of forming a catalytic layer by spraying a catalytic material fluid containing ionomer and catalyst, such as carbon-supported platinum, on a substrate surface and subsequently drying the fluid to form a layer. A layer that forms by this method is denser than desired. To achieve the porosity required for the catalyst layer to function, i.e., transport of gases and other chemicals through the layer, the catalytic material fluid described in U.S. Pat. No. 5,861,222 includes a "pore forming material" such as carbonates and bicarbonates that are subsequently removed by treating the layer with acid, such as sulfuric acid, so as to develop the requisite porosity.

U.S. Pat. No. 6,403,245 issued 11 Jun. 2002, describes a method of forming catalytic fuel cell layers by co-depositing catalytic particulates, e.g., platinum particulates, formed by combustion chemical vapor deposition (CCVD) and at least a solution containing NAFION (persulfonated polytetrafluoroethylene) and/or suspended carbon particulates. The layers produced by the method of U.S. Pat. No. 6,403,245 may be thin and conformal. By "conformal" is meant that the deposited catalytic layers conform in contours to the uneven contours of the substrate on which the layer is deposited, both the surface of the layer on the substrate and the opposite surface of the layer generally conforming in contour to that of the substrate. Such conformal layers exhibit generally uniform thickness that contributes to the efficiency of the layer. While the conformal nature of the layer that forms contributes to the catalytic efficiency of the layer, deposition of layers as described in U.S. Pat. No. 6,403,245 has difficulties with high speed, large-scale deposition of catalytic materials and does not account for a variable permeable substrate.

Critical to the operation of the fuel cell, whether a PEFC or a DMFC, is the proton-conducting membrane. The present invention is further directed to proton-conducting membranes that provide unique properties or utilities and the method of their manufacture.

General properties of proton-conducting membranes are that they exhibit ionic exchange capacity, proton conductivity, thermal stability, mechanical stability, and chemical stability, particularly electrochemical stability, i.e., the chemical components are neither reduced nor oxidized during constant cycling. Low cost is also an important consideration in proton-conducting membranes.

The present invention, therefore, is directed to methods and apparatus for providing porous catalytic layers with high levels of catalyst and high effective catalytic surface area of the catalyst and to proton-conducting membranes that provide unique properties or utilities and the method of their manufacture. The method of the present invention provides for efficient, large scale deposition of catalytic material to form catalytic layers.

SUMMARY OF THE INVENTION

In accordance with one aspect of the invention, catalytic material containing carrier liquid(s) is directed through an enclosed, elongated pathway at a surface of a substrate. Sufficient thermal energy is provided to the material passing through the elongated pathway such that when particles of catalytic material reaches the substrate surface, it is finely divided and sufficiently dry that a functional layer forms that is porous and that provides high catalytic activity per level of catalyst used.

In accordance with another aspect of the invention, carbon-supported catalyst is provided at an upstream location, the carbon-supported catalyst preferably produced in situ from carbon particulates and CCVD-produced catalyst. Carrier liquid, such as water and/or alcohol, is substantially removed from the carbon-supported catalyst prior to being introduced into a finely divided spray of a solution of ionomer, such as NAFION® (persulfonated polytetrafluoroethylene). This mixture of ionomer and carbon-supported catalyst is deposited on a substrate surface.

In accordance with another aspect of the invention, when the substrate has sufficient porosity for gases to flow through the substrate, a vacuum is applied to the substrate from the side opposite the deposition surface, thereby pulling the deposition mixture into pores of the substrate. By use of the vacuum, pores in the substrate are filled, higher deposition rates and efficiencies are achieved, and improved adhesion of the deposited layer to the substrate is realized.

Apparatus in accordance with the invention can be operated in a number of modes of deposition with different combinations of materials or materials formed by various methods. For example, pre-formed carbon-supported catalyst (e.g., carbon-supported Pt) may be deposited along with ionomer.

In accordance with another aspect of the present invention proton-conducting membranes are produced having novel and/or enhanced properties which provide fuel cells with enhanced capacity and/or improved functionality.

In accordance with another aspect of the invention, a proton-conducting membrane is produced that is operable at high temperatures which enables the fuel cells to operate with enhanced efficiency. These membranes are produced by co-depositing a proton-transfer medium, such as a proton-transferring ionomer, and a water-binding material, such as a water-binding oxide, e.g., silica, or a zeolite.

In accordance with another aspect of the invention, a proton-conducting membrane for a PEFC is produced having self-humidification properties. A catalytic material such as platinum is deposited in a proton-conducting membrane to promote a reaction between hydrogen and oxygen that may diffuse into the membrane. Preferably, in some cases, the catalyst is deposited in a discrete intermediate layer of proton-transfer material.

In accordance with another aspect of the invention, a proton-conducting membrane for a DMFC is provided with methanol cross over resistance by depositing a very thin film or layer of a methanol barrier material, such as silica or zirconium phosphate

BRIEF DESCRIPTION OF THE DRAWINGS

FIG. 2 is a side plan view of apparatus in which catalytic layers are deposited with a modification of apparatus of FIG. 1.

FIG. 3 is a side plan view of alternative apparatus of FIG. 2 in which catalytic layers are deposited.

FIG. 4 is a plan view that is applicable to portions of either FIG. 2 or FIG. 3.

DETAILED DESCRIPTION OF CERTAIN PREFERRED EMBODIMENTS

Figure 1:
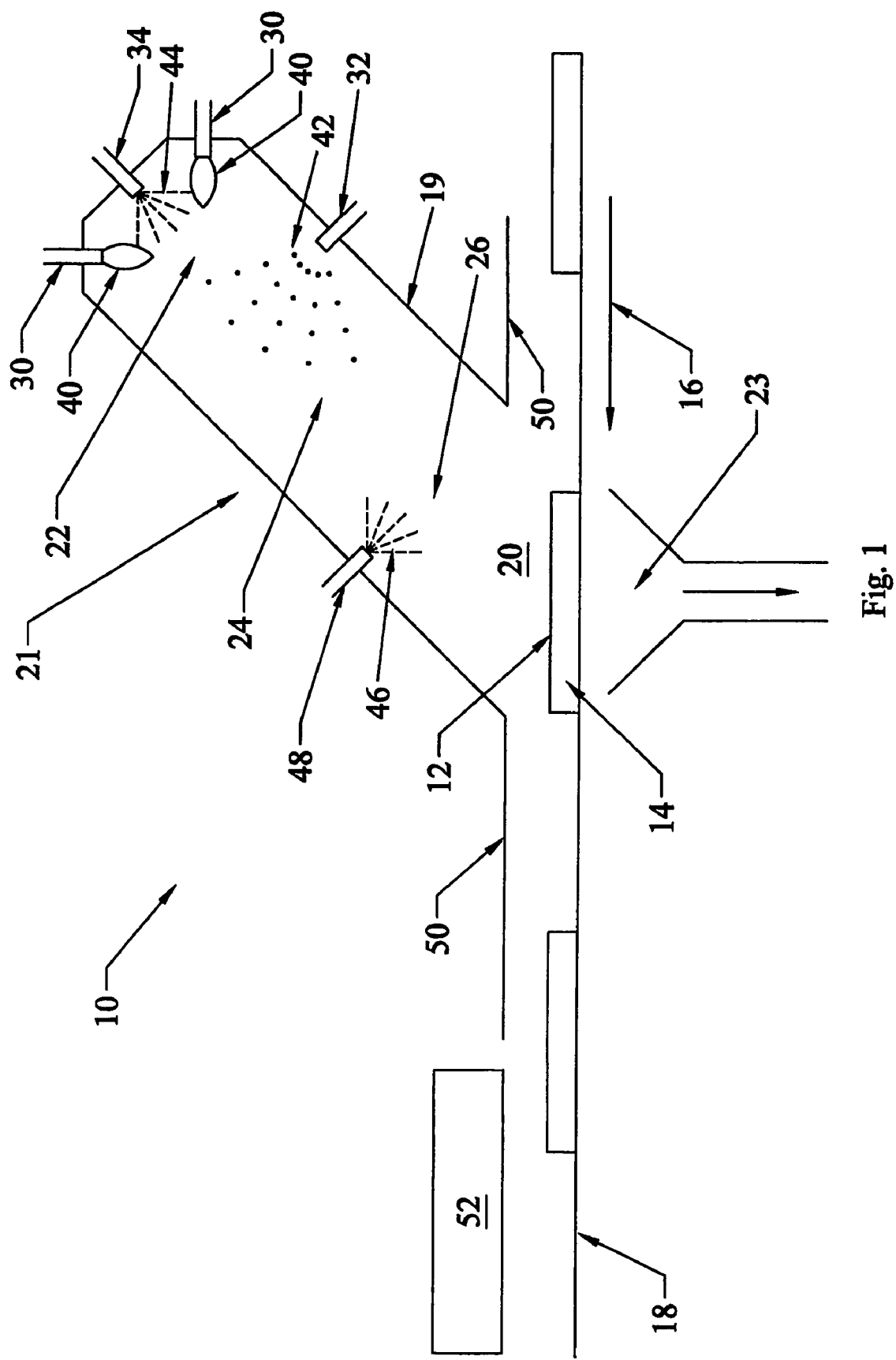
FIG. 1 is a diagrammatic illustration of deposition apparatus in accordance with the invention.

Deposition apparatus described herein is useful for depositing a porous catalytic layer from catalytic material comprising catalytic particulates, e.g., carbon; conductive particulates, e.g., carbon; and polymer, e.g., NAFION® (persulfonated polytetrafluoroethylene). The components of the catalytic material may be supplied and/or generated within the apparatus individually, or two or more of the components may be pre-formed or pre-mixed together. Operation of the apparatus described in reference to FIG. 1 is most complex when the individual components of the catalytic material are separately introduced into the apparatus and/or separately formed in the apparatus; accordingly, the apparatus will be first described herein in terms of this mode of catalytic material layer deposition. Subsequently, more simplified operation of the apparatus will be described in reference to depositions in which two or more of the materials are introduced as co-formed and/or co-mixed materials.

The materials that form the catalytic layers include both soluble and insoluble materials. The catalyst material, generally a metal(s) and conductive material, typically carbon, are insoluble, whereas the ionomer may be dissolved in a liquid, such as water or alcohol. However, even the ionomer may be only partially dissolved in carrier liquid, such as water or alcohol, and may exist in the carrier liquid as a suspension or a suspension/solution. For this reasons fluids used for depositing the material may be described herein as "solution/suspensions" or "solution and/or suspension", the fluids often containing both dissolved and suspended solids or liquids.

Illustrated in FIG. 1 is a diagrammatic representation of the deposition apparatus (10) by which catalytic membrane material is deposited on a surface (12) of a substrate (14) that is transported in the direction of arrow (16). (The apparatus could also be operated with the substrate transported in the direction opposite to that shown by arrow (16).) The substrates (14) illustrated in the Figure are pre-cut individual substrate sheets carried by a horizontally moving conveyer (18) through a deposition zone (20), As an alternative, the substrate could be a continuous reel transported between an upstream roll and a downstream roll.

With reference to a method in which the components of the catalytic membrane, i.e., the catalytic particulates, the electrically conducting particulates, and a polymer, are individually introduced into and/or formed within the apparatus, a deposition housing (19) provides an elongated passageway or tunnel (21) providing an upstream catalyst introduction region (22), an intermediate drying region (24), a downstream ionomer mixing region (26), and the deposition region (20) downstream of the mixing region (26). It is to be understood that the apparatus provides a continuous flow of material that is processed in and flows through the tunnel (21), and that there is no sharp delineations between the above-described regions that are described herein in functional terms with respect to the deposition process.

In a currently preferred embodiment, nozzles (30), (32), and (34) are used to introduce material into the upstream catalyst-introduction region (22) of the tunnel (21). Through nozzles (30) are introduced a precursor solution for catalyst, such as platinum, ruthenium, gold, palladium, etc. and mixtures of such catalysts. The precursor solution is introduced as a finely divided aerosol is preferably produced by apparatus described in U.S. Pat. No. 6,132,653 that is capable of producing sub-micron droplets of solution. The apparatus described in U.S. Pat. No. 6,132,653, in which fluid is atomized by passage under pressure through a heated tube, is advantageously utilized in the processes of the invention whenever very fine droplets of fluid are desired. Where very fine droplets are not required, more conventional atomizing apparatus, such as apparatus that atomizes fluids by shear forces, may be used. Thus, then the term "nozzle" is used herein, it is to be understood that nozzle selection will be according to the requirements of the particular deposition method chosen. The various nozzles described herein extend through ports in the housing (19); and the various ports can facilitate alternate types of nozzles according to the requirements of the particular deposition method or can be selectively closed off if not required for the particular deposition method.

Using the apparatus described in U.S. Pat. No. 6,132,653 in conjunction with dilute solutions of catalyst precursor, very tiny particulates of catalyst may be produced, e.g., having mean particulate diameters in the range of from about 2 nanometers to about 200 nanometers. The carrier liquid in the solution is a flammable liquid or mixture of flammable liquids and the atomized droplets are ignited to produce CCVD flames (40) as described in U.S. Pat. No. 5,652,021. Precursor chemicals for Pt, Ru, Au, Cd, and a variety of other metals are described, for example, in U.S. Pat. No. 6,208,234. The teachings of all patents and applications discussed herein are incorporated by reference. The material used as the catalyst is not limited and any effective material may be used.

The apparatus in above-discussed U.S. Pat. No. 6,132,653 atomizes a fluid by passing them through a tubular pressurized region and heating the fluid while in this tubular portion. When the fluid exits the tube, the pressure drops; the fluid rapidly atomizes into very small droplets, and evaporation of liquid components from the tiny droplets happens very rapidly. When such apparatus is used for one or more of the fluids, the vaporizing liquid(s) contribute significantly to the gas through-put of the apparatus, it being appreciated that gas has a volume about 3 orders of magnitude than liquid. By use of an elevated temperature tunnel (21) in which liquid(s) is almost instantaneously turned to gas in the apparatus, helping to maintain separation of spray particles and aiding in drying. This contributes to deposition efficiency of the apparatus. A flux of layer-forming particulates is produced within the tunnel (21).

In one embodiment, through nozzle (32), just downstream of the CCVD nozzles (30), is introduced a cloud (42) of carbon particulates which preferably have mean particulate diameters of between about 20 and about 2000 nanometers. In one embodiment of this deposition method of the invention, the carbon particulates are introduced as a cloud (42) of dry powder. However, the carbon could be provided as an atomized slurry or particulates in a carrier liquid, such as water. Because the upstream region (22) contains a CCVD flame, powdered carbon, if introduced in dry form, would be susceptible to combustion if the temperature were too high. Accordingly, through nozzle (34) is introduced a spray (44) of fluid, e.g., gas and/or liquid, such as water, that acts not only to prevent combustion of the finely divided carbon particulates but acts to quench the flame-produced vapors and form very fine particulates of catalyst. This quench also "freezes" the catalyst particle size at a desired small size.

In the intermediate region (24), heat from the flame vaporizes any quench water, and also vaporizes any carrier liquid for the carbon if introduced as a slurry of wet particulates instead of a cloud (42) of dry particulates. At the same time, CCVD-produced catalyst mixes with and deposits on surfaces of the carbon particulates, thereby producing, in situ, particulates of carbon-supported catalyst. The amount of quench fluid introduced as spray (44) (and optionally associated with the carbon) is tuned to the heat source which is illustrated as the flame (40) such that the carbon-supported catalyst at the end of the intermediate region is substantially dry and be free-flowing as it enters the downstream ionomer mixing region (26). Because the carbon-supported catalyst particulates are substantially dry and free-flowing, they do not agglomerate, but instead are mixed with a finely divided spray or aerosol (46) of ionomer (generally aqueous) solution/suspension introduced through nozzle (48) to the mixing region, and produce a layer-forming material in which individual carbon-supported catalyst particulates are individually contained and isolated within the ionomer. Remaining thermal energy from the flames drives off a substantial amount of the carrier liquid from the ionomer, although some carrier liquid may be left in the material as it is deposited in the deposition region (20) on the substrate surface (12). The material must be sufficiently dry to adequately disperse and uniformly deposit on the substrate. It is preferred that the coating be uniform in regard to the permeability of the substrate. While nozzle (48) is illustrated as delivering only a spray (46) of ionomer solution, additional flames or other heat sources (not shown) may be provided in association with nozzle (48) to provide further thermal energy as may be needed to achieve the requisite material formation and/or drying.

In any of the cases, the substantial drying of the combined catalytic material is considered an important aspect of the present invention. After leaving the mixing zone (26) and before reaching the substrate surface (12), the combined agglomerate particulates are sufficiently dried that they deposit on the substrate surface (12) without substantial coalescence but more as a collection of individual agglomerate particulates, although residual moisture may help such agglomerate particulates stick together. As a result, the layer that forms exhibits porosity sufficient to promote gas passage into and through the membrane. This contrasts with above-discussed U.S. Pat. No. 5,861,222 in which the sprayed material must include a pore-forming material that fills a portion of the volume of the layer and must be subsequently removed, e.g., with an acid. Deposition in accordance with the invention not only obviates the step of removing pore-forming material, but obviates problems of inconsistent and/or incomplete removal of such material.

The material is sufficiently dried prior to reaching the substrate. While the material may be deposited as a non-flowing layer on either a non-porous or a porous substrate, it is most important that the material be non-flowing as deposited on a porous substrate, such that the material is not sucked by vacuum substantially into or through the substrate. Even on a non-porous substrate, it is desirable that the layer not flow when deposited. Of course, if the substrate is non-porous, a vacuum will not be used to draw the material into the substrate, as may be the case with porous substrates. In such case it may be beneficial to have the material sticker (wetter) and or use electrostatics.

At the end of the tunnel housing (19) there is provided a horizontal flange (50) disposed closely adjacent to the substrate surface passing therebelow. The flange (50) helps to direct the flow of gases exiting the tunnel (21) to flow horizontally along the substrate surface (12) and thereby efficiently deposit the catalytic membrane material on the surface (12). A downstream heater (52) may be employed to add additional thermal energy to the deposited catalytic layer and thereby assist in drying such layer. The downstream heater (52) further helps to maintain uniformity of temperature of the layer from the time it leaves the deposition region (2) and the time it is conveyed from the deposition apparatus (10), thereby minimizing undesirable convection.

The electrode substrate is generally porous, because, when used in a fuel cell, gases and liquids are generally required to pass through the substrate. The substrate may, for example, be a woven or non-woven graphite fiber cloth. A currently preferred substrate is a woven graphite fiber cloth that is coated on its deposition surface with a mixture of carbon particulates and polytetrafluoroethylene (TEFLON®) particulates. The porosity, at least prior to deposition, is sufficiently porous for gases to pass through the substrate. To draw gas-carried, layer-forming material to the substrate surface (12) and into substrate pores, a vacuum source (23) is disposed below the passing substrate (14) in the gas flow path from the tunnel. To allow gas flow through the substrate, the substrate may be supported at its edges by a frame and/or may rest on a screen. The application of vacuum through the substrate (14) results in higher deposition efficiency, i.e., a higher percentage of membrane-forming material depositing on the substrate surface; filling in of pores that are overly large for fuel cell operation, and better adhesion of the deposited layer to the substrate. The intensity of the vacuum is adjusted according to a variety of factors, including gas flow rate above the substrate, pore size and porosity of the substrate, and composition of the layer-forming material being deposited on the substrate surface (12).

As noted above, the carbon particulates, rather than being introduced dry, could be dispersed in water or an aqueous solution and this dispersion introduced into the upstream region along with the catalyst-producing CCVD flame. By this variation, a separate spray of quench water may be eliminated as the wet particulates will not burn. Wet carbon could be introduced either through nozzle (34) or nozzle (32).

As a further alternative, pre-formed carbon-supported catalyst particulates, e.g., pre-formed carbon-supported platinum particulates, may be dispersed in a carrier liquid, such as water and/or alcohol and this dispersion preferably introduced through nozzle (34). Particulates of carbon supporting smaller particulates of platinum are available, for example, from Johnson Matthey. In this variation, the heat source, flames (40) are produced only from organic solvent without precursor material for a catalyst, or an alternate, non-flame heat source may be used. In this alternative method, as in several other alternative methods, flames (40), if used as the heat source, may function only as the heat source without producing any deposited substance. Nozzle (32) is not used, and this nozzle may be removed from its port through the housing (19) and this port sealed off. The thermal energy, e.g., from the flame or alternate heat source, is still required to substantially dry the particulates in the intermediate region before reaching the downstream ionomer mixing region. Because the flame in this variation is not producing the catalyst, alternative heating means, such as conductive heating, inductive heating, or a flow of hot gases could be used to heat the materials within the tunnel (21) to achieve the requisite degree of drying at each region.

It should be appreciated that while utilization of the apparatus is described herein in respect to currently preferred embodiments, modifications are anticipated in the future to meet specific needs, and such modifications obvious to one with ordinary skill in the art are considered to be within the scope of the invention. For example, the various fluids and particulate matter may be described herein with respect to certain embodiments as being introduced through specific nozzles (32), (34) and/or (48); however introduction through a choice of such nozzles, which are stationary or movable, may vary according to need in any specific application.

Carbon supported catalyst could also be introduced in dry form, e.g., through nozzle (32). In this case, thermal energy from a source other than a flame may be preferred over a flame so as to avoid burning the carbon of the catalyst. If flames (30) are used to provide the thermal energy, a quench spray is used in conjunction with the cloud (42) of supported catalyst.

As a further alternative, a solution/suspension of all materials, including carbon-supported catalyst and ionomer may be introduced through a single nozzle, e.g., nozzle (34). Such a solution/suspension will be introduced into the tunnel (21) as a very fine aerosol such as may be produced by the atomizing device described above. Again, flames (40) or another source of thermal energy is provided to significantly dry the atomized material prior to deposition on the surface (12) so as to substantially increase the material's coherency and thus produce a layer with desired porosity. In this method of deposition, the material may be introduced through a single nozzle, e.g., nozzle (34), or any other of the nozzles or combination thereof, and one or more nozzles may be inactivated or even withdrawn from the housing and the ports sealed for this variation of membrane deposition method. In this variation of the layer deposition, as in the alternative variations, the vacuum (23) promotes efficient deposition of the catalytic layer, closing of large pores in the substrate (12), and good adhesion of the catalytic layer to the substrate.

Gas permeable substrates have regions of high gas permeability and low permeability. An advantage of the invention realized when vacuum is used to draw material into the substrate is that the catalytic material is preferentially drawn to the more gas permeable regions of the porous substrate. This is desirable so that larger amounts of catalyst become located in the more gas flow-accessible regions where the catalyst is more likely to be contacted by flowing fluids and therefore more likely to function catalytically. In accordance with the invention, an electrocatalytic layer (ECL) that is, in combination, a gas permeable substrate and ionomer-supported catalytic material deposited thereon, catalyst loading is higher in the more gas permeable regions of the ECL than in the less gas permeable regions of the ECL.

In this regard, the ECLs of the present invention have a maximum catalyst loading, in the through-the-ECL direction, (more gas permeable regions) that is at least 10% greater then the average catalyst loading, preferably at least 30% greater, and more preferably at least 50% greater. This differential in catalyst loading refers only to the catalyst itself, e.g., platinum, gold, platinum/ruthenium, palladium, etc., and not necessarily the other materials of the layer, such as carbon particulates. Such loading variations are achievable by the apparatus of the present invention which uses a pressure differential to draw material into a porous substrate, e.g., carbon "paper".

One advantage of the apparatus described herein above is that a high flux of very finely atomized material may be produced within the tunnel (21), whereby a large amount of material may be deposited per volume of gas flow. This promotes efficiency of deposition as is required for high volume throughput of substrates (12). Specifically, the length of low pressure section (23) can be adjusted so that a very significant portion of the gas that entrains the material to be deposited is drawn through the porous substrate during deposition, preferably at least 30% of the gas, more preferably at least 60%, even more preferably at least 90%.

When material is introduced through a nozzle (34) and/or produced by flames (40) at the upper end of the chamber (21) and additional materials are introduced through side nozzles (23) and/or (48), substantial turbulence is created in the chamber (21) thereby promoting efficient mixing of materials within the chamber (21).

A particular advantage of the method and apparatus of the invention is that by depositing the material in a relatively dry state, there is a relatively low moisture content in the deposited material. Also, the as-deposited material has a low density due to its very porous nature. As a result of low moisture content and porous routes for vapors to escape, "mud cracking" or "desiccation cracking" is minimized or eliminated.

Further, the material does not liquid flow through the permeable substrate even when a pressure gradient is applied. To enable a fine spray, the initial material must have a sufficiently low viscosity, but low viscosity liquids flow with applied forces such as pressure gradients, e.g., those produced by a vacuum source. The present invention provides for a very fine spray with intermediate drying such that the resulting deposited material does not liquid flow under a pressure gradient of 2 inches (5 cm.) of water, and more preferably does not liquid flow under even higher pressure gradients, such as 5 inches (12.7 cm) of water, 10 inches (25.4 cm) of water, 15 inches (38.1 cm) of water, 20 inches (50.8 cm) of water, and even higher. The higher the pressure differential, the more uniform a non-catalytic base coat or the more selective the catalyst to permeable zones.

Illustrated in FIGS. 2, 3 and 4 are modifications of the Apparatus of FIG. 1 adapted in a manner to capture more of the catalytic material produced in chambers (21) as catalytic layers (57) and/or further could be used to produce, in-line, partial fuel cell assemblies (59) that include a proton-exchange membrane (56) and an anode and/or a cathode.

In each of FIGS. 2 and 3, inner proton exchange membrane (56) and outer anode porous material web (58) and cathode material web (60) are continuously conveyed from right to left with respect to the orientation of the drawings on the page through nips provided by pairs of opposed rollers (68) that bring the membrane (56) and webs (58) and (60) together as a unitary partial fuel cell assembly (59). In FIG. 2, the catalytic layer (57) is deposited between the proton exchange membrane (56) and the anode porous material web (58) at an upstream location and between the proton exchange membrane (56) and the cathode porous material web (60) at a downstream location. (The order of anode and cathode deposition, of course, could be reversed.) In the FIG. 3 apparatus, the catalytic layers (57) are deposited simultaneously at a single horizontal location on both the anode side and the cathode side. FIG. 4 is a plan view that could represent either the top of the upstream location or the downstream location of FIG. 2 or either the top or the bottom of FIG. 3 with optional vacuum sources (23) not shown in FIG. 4. While FIGS. 2, 3 and 4 show deposition on webs of materials moving generally in horizontal planes, deposition may be in any orientation, including vertically upward and vertically downward.

In each of the apparatuses of FIGS. 2 and 3, catalytic material is produced and/or supplied from a pair of chambers (21), such as is described in detail with respect to FIG. 1. Attached to the material exit ends of chambers (21) are interior fluid dams (64) which in cooperation with side fluid dams (74) define substantially enclosed regions (62) and (66) in FIG. 2 and (70) and (72) in FIG. 3 along with one of the porous webs (58) or (60) and the proton exchange membrane (56). With the material exiting chambers (21) into these enclosed regions, (62), (66), (70) and (72), a major portion of the material exiting from each chamber contacts and deposits on the membrane (56) or the web (58) or (60). This enhances deposition efficiency, a very important feature considering that the catalytic material includes expensive metals such as platinum, gold, ruthenium, or the like.

Vacuum sources (23) are shown in FIGS. 2 and 3 to draw fluid through the porous material webs (58) and (60), although because of the efficiency of deposition rate inherent in the configuration of the FIGS. 2 and 3 apparatuses, these vacuum sources (23) are considered optional in these embodiments.

The material exiting chambers (21) is sufficiently dry to flow freely in the gas stream from the chamber, but may retain sufficient moisture to be tacky. Thus, when the membrane (56) and webs (58) and (60) are drawn through the nips between rollers (68), the material deposited on both the membrane (56) and webs (58) readily join together as a unitary catalytic material layer (57).

It should also be appreciated that it is not necessary to combine two layers on which materials are co-deposited, in which case the nip rollers (68) would not be used. For example, catalytic layers may be simultaneously deposited on two webs of gas permeable substrate or on two sheets of membrane. In such case, these materials would be combined with other components of the fuel cell assembly later.

It is also contemplated within the invention that two or more deposition apparatuses (2) may be used in-line with each other, so as to deposit material of one composition directly on the substrate and another composition or to the first layer away from a substrate. In many cases it is desired that a relatively low concentration of catalyst be present near the electrode substrate and a relatively higher concentration of catalyst be present away from the electrode substrate. Thus, at an upstream location, a deposition apparatus (21) may be used to deposit material that contains little or no catalyst. This initially deposited material helps to equalize permeability across the substrate. Subsequently, at a downstream location, a second deposition apparatus (21) may be used to deposit the material having the relatively high concentration of catalyst. When the electrocatalytic layer (ECL) is assembled in a fuel cell, the higher concentration of catalyst will be adjacent to the proton exchange membrane (PEM). In operation of the fuel cell, gas (or liquid) will flow readily through the substrate coated with the material having the low concentration of catalyst, but then the before reaching the PEM, substantial contact of the fluid with catalyst occurs in the material having the higher concentration of catalyst.

Multiple deposition apparatuses (21), even more than two, may be used to deposit even more layers of material of varying composition, or multiple deposition apparatuses (21) may be used to achieve added uniformity across a substrate.

In FIGS. 1–3, the substrates are illustrated and described as moving horizontally in a right-to-left direction. To coat wide dimension substrates and/or to achieve greater deposition uniformity, the deposition apparatuses (21) may be reciprocated across the substrate, i.e., in and out of plane of the page with respect to FIGS. 1–3.

The apparatus of the invention is particularly useful for forming conductive porous base layers to support the electrocatalytic layers (ECL) starting with carbon "paper", i.e., thin woven carbon, as the substrate. The ECL requires support for electrical and physical stability due to the deformation forces of such transients as thermal changes, gas flow, electrical fields and membrane swelling. To deposit on carbon "paper", a uniform flow field is highly desirable from standpoints of efficient deposition of expensive catalytic materials, e.g., platinum and ruthenium, highest membrane performance, and absence of cold/hot spots that could create stress or decomposition issues.

Such uniform flow fields in a base support layer are accomplished through the use of minimal liquid remaining in the flow spray deposition with a flow field through the substrate, e.g., as by drawing the gases and material through the substrate. The deposition of finely divided material needs to be more gas flow field controlled than momentum controlled. To achieve this, very fine droplet sizes are required such that the droplets achieve a velocity similar to the velocity of the gas-stream. If the droplets are semi-dry to dry when they reach the substrate, they do not stick as easily upon initial contact with the substrate if they lightly "bump" into the substrate, e.g. hit the fibers at low-permeable areas of the substrate, but tend to continue in motion and become fixed within pores, i.e., high-permeable areas, where they are lodged by gas flow through the substrate. By filling of the pores more than depositing over the fibers or "solid" places themselves, the gas permeabilities across the ECL tend to be equalized. Through use of apparatus in accordance with the invention, ECLs produced on gas-permeable substrates, e.g., carbon "paper", have gas permeabilities that vary from location to location, e.g., comparing any 10,000 micron$^2$ to any other 10,000 micron$^2$ area, preferably any 1000 micron$^2$ area to any other 1000 micron$^2$ micron square area, by less than 50%, preferably less than 30%, more preferably less than 10%.

Figure 5:
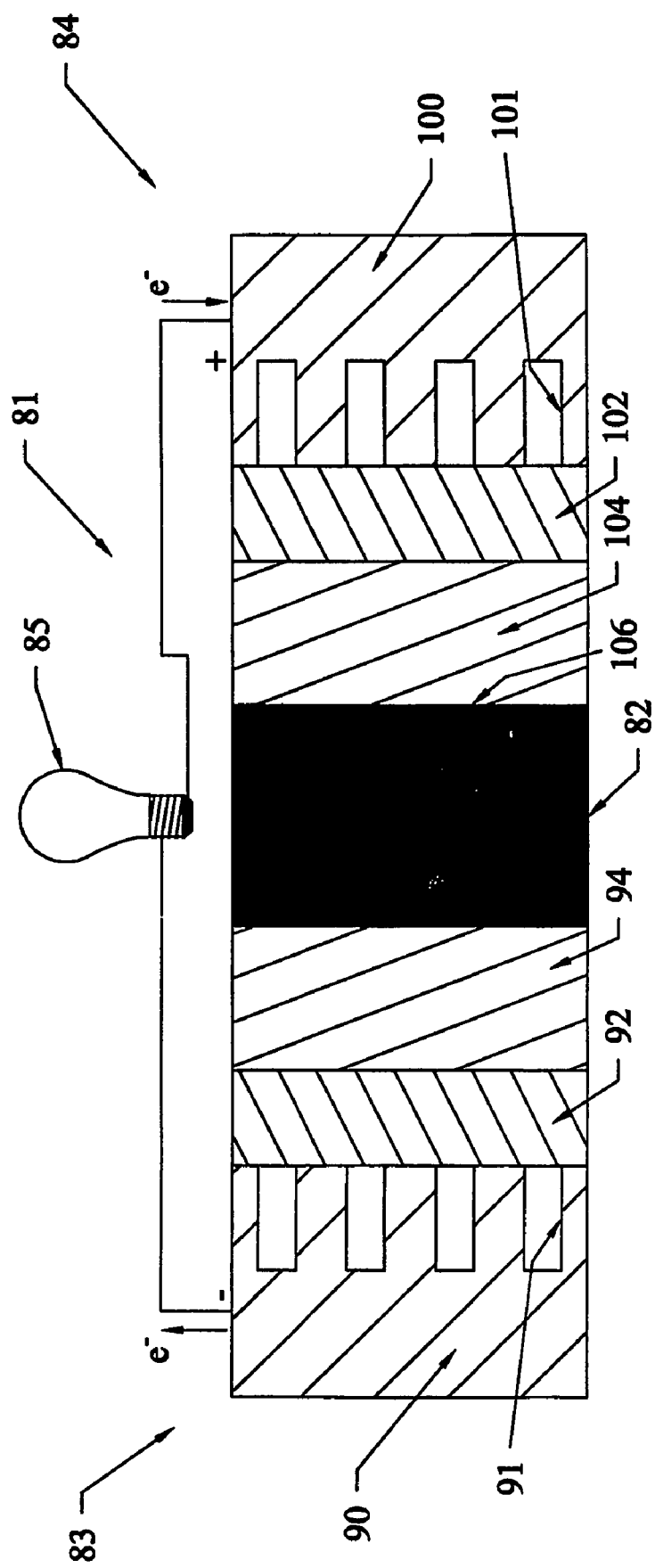
FIG. 5 is a schematic cross-sectional view of a fuel cell that utilizes proton-conducting membranes in accordance with the invention.

The illustrated fuel cell (81) in FIG. 5 is provided with a solid polymer electrolyte membrane (82) in the middle, an oxidation or anode electrode (83) at one side thereof to which an oxidizable fuel, such as hydrogen or methanol is supplied, and a reduction or cathode electrode (84) at the other side to which air as an oxygen source is supplied. It is the electrolyte or proton-conducting membrane (82) to which this aspect of the present invention is primarily directed, various embodiments of such membrane providing novel utilities.

With respect to FIG. 5, on the left-hand (anode electrode 83) side is a fluid flow plate (90) having grooves (91) that separate fluid, such as hydrogen gas or liquid methanol, and collects gas generated. This may be formed of conductive material, such as stainless steel or graphite, and machined to form the fluid diffusion grooves. Adjacent to the fluid flow plate (90) is a bonded carbon cloth (92). Inward of this is a catalyst layer (94) into which hydrogen gas or liquid methanol diffuses and is oxidized to form the protons that diffuse through the proton exchange membrane (82) toward the cathode (84) side. The catalytic layer contains materials such as platinum; ruthenium as a carbon monoxide scavenger; and, optionally, carbon particulates as a platinum/ruthenium support.

The cathode electrode structure (84) is similar to the anode electrode (83) structure, having from right-to-left with respect to FIG. 5 a gas flow plate (100) having gas flow grooves (101), a bonded carbon cloth (102), and the layer (104) into which oxygen gas diffuses and receives protons from the proton-conducting membrane (82) to reduce the oxygen.

In a PEFC cell, H$^+$ ions (protons) are produced from hydrogen in the anode (83) and migrate from the anode side to the cathode side (84) through the electrolyte membrane (82). Electrons generated in the anode electrode (83) perform external work in a load (85), and the electrons then return to the cathode electrode (84) of the fuel cell (81). In the anode electrode (83), the protons (H$^+$) are produced by removing the electrons from hydrogen molecules. In the cathode electrode (84) the protons (H$^+$) that have passed through the membrane (82), along with the oxygen gas supplied from the cathode gas, and the electrons received from the anode produce water molecules.

In a DMFC cell, the net reaction is the oxidation of methanol to carbon dioxide and water. The cathode and anode reactions are as follows:

Cathode: 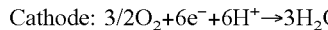 $3/2O_2+6e^-+6H^+ \rightarrow 3H_2O$

Anode: 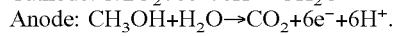 $CH_3OH+H_2O \rightarrow CO_2+6e^-+6H^+$.

Production of novel proton-conducting membranes in accordance with the invention is enabled by the process of combustion chemical vapor deposition (CCVD) or a modified CCVD process. CCVD is described, for example, in U.S. Pat. No. 5,652,012, the teachings of which are incorporated herein by reference. CCVD deposition of platinum is specifically described, for example, in U.S. patent application Ser. No. 09/198,954 filed 24 Nov. 1998, the teachings of which are incorporated herein by reference. Deposition of phosphate films by CCVD is taught in U.S. Pat. No. 5,858,465, the teachings of which are incorporated herein by reference. Herein, CCVD is utilized to deposit very thin films or layers of materials that provide unique properties to proton-conducting membranes and/or deposit very small, homogeneously admixed domains of materials that provide unique properties to the proton-conducting membranes.

It is known that, up to a point, the higher the operating temperature of the fuel cell, the more efficiently the fuel cell operates; this is true of both PEFC and DMFC cells. However, operating temperature is limited by the need to maintain the degree of hydration of the hydrogen conducting membrane required for proton-transfer through the membrane. While the membranes are described as "proton-conducting" membranes, the protons actually exist in the membrane as hydrated species, not as isolated protons. Thus there exists the need to maintain adequate hydration of the proton-conducting membrane.

Because water boils at 100° C., operation of PEFC or DMFC fuel cells at 100° C. or above has proven difficult. Various patents have proposed inclusion of water-retaining materials within the proton-conducting membrane material. However, prior art techniques for inclusion of such water-retaining materials have provided relatively large, spatially isolated domains of such materials within the membranes, and water-retention over extended cycling of the fuel cells has been less efficient than desired. By using CCVD or modified CCVD processes, very small domains of water-retaining materials can be deposited within and homogeneously distributed within a proton-conducting medium. This allows operation of fuel cells at temperatures above 100° C., preferably at 150° C., and even at temperatures of 200° C. or above The most common proton-transfer media for use in proton-conducting membranes are ionomers, such as a sulfonated perfluoro ether, e.g., that sold as Nafion®. Such ionomers can be deposited from a solution that is co-deposited with CCVD flame-produced material. However, proton-conducting material may be an inorganic material, such as zirconium phosphate or silicotungstic acid, that can be deposited directly from a CCVD flame along with the water-binding material.

The most common proton-transfer media for use in proton-conducting membranes are ionomers, such as persulfonated polytetrafluoroethylene, e.g., that sold as Nafion®. Such ionomers can be deposited from a solution that is co-deposited with CCVD flame-produced material. However, proton-conducting material may be an inorganic material, such as zirconium phosphate or silicotungstic acid, that can be deposited directly from a CCVD flame along with the water-binding material.

The water-binding material that provides for water retention within the proton-conducting membrane is generally a water-binding oxide or mixed oxide, such as silica or a zeolite. Zeolites are naturally hydrated silicates of aluminum plus sodium and/or calcium and/or potassium. Such water-binding oxides are easily produced by CCVD flames from a precursor solution containing chemical precursors of the mixed oxides. When co-deposited with a proton-transfer material, either an ionomer, such as Nafion® (persulfonated polytetrafluoroethylene), from a co-deposition solution, or an inorganic material co-deposited from a CCVD flame, the water-binding oxides are deposited in very small domains that are homogeneously and intimately admixed with the proton-transfer material and serve to maintain adequate hydrolysis levels of the membrane. The weight ratio of the water-binding material to the proton-transfer material in the membrane may vary over a wide ratio, depending upon the particular materials selected and the desired operating temperature of the fuel cell. Typically the weight ratio of the water-binding material to the proton-transfer material ranges from about 1:20 to about 2:1.

CCVD chemical precursors for oxides and mixed oxides, as well as chemical precursors for metals, such as platinum, are described, for example, in above-referenced U.S. patent application Ser. No. 09/198,954 filed 24 Nov. 1998.

If the proton-transfer material is an inorganic material, such as, zirconium phosphate or silicotungstic acid, both the proton-transfer material and the water-binding material can be deposited from a common CCVD flame from a mixed precursor solution, as is described in above-referenced U.S. Pat. No. 5,652,012.

Most commonly, however, the proton-transfer material for the proton-conducting membrane is an ionomer, Nafion® (persulfonated polytetrafluoroethylene) being the currently preferred ionomer. In such case, the ionomer is deposited from a non-flame spray(s) of ionomer solution, while the inorganic water-binding material is deposited from a CCVD flame.

Figure 7:
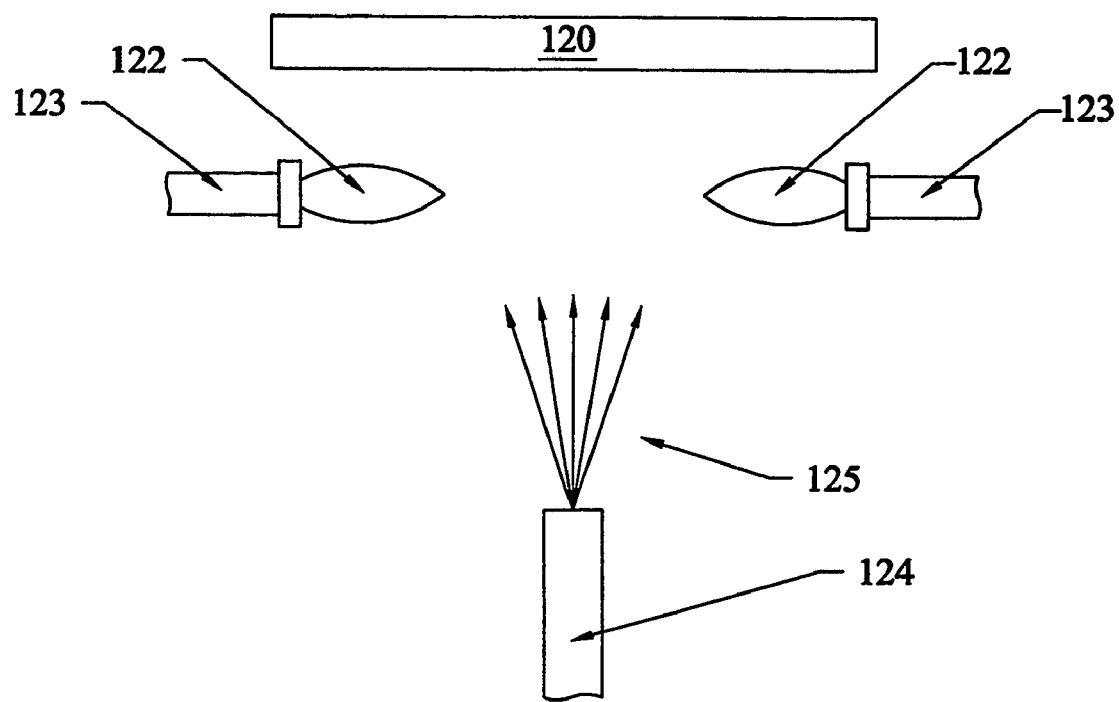
FIG. 7 is a diagrammatic illustration of a combustion chemical vapor deposition (CCVD) or modified CCVD deposition arrangement for depositing proton-conducting membranes in accordance with the invention.

Shown in FIG. 7 are two CCVD flames 122 for depositing water-binding material. These are shown producing flames in a direction parallel to the surface of a substrate 120. The flames are each produced by burning, in open atmosphere, a finely atomized solution of a water-binding oxide or mixed oxide precursor chemical(s). By adjusting the concentration of the precursor chemical(s) and the size of the droplets in the aerosol, as is known in the art, the domains of water-binding material may be varied over a wide size range. Preferably, the oxide or mixed oxide domains are in the range of mean particulate size of about 20 nanometers in diameter or less, more preferably 7 nanometers or less. The small domain size of the water-binding material provides for very efficient binding of water throughout the membrane, enabling operation of the fuel cell at elevated temperatures.

Also, illustrated in FIG. 7 is a nozzle 124 that produces a non-flame spray of a solution containing dissolved ionomer. As it is desired that the ionomer not burn, it is preferred that the solvent system for the re-direct, non-flame spray contain a substantial portion of water, i.e., at least about 50 wt % of the solvent system is preferably water. The ionomer solution might optionally contain suspended particulates of materials that would impart desired characteristics to the membrane. Such suspended particulates are typically of a size range of about 40 nanometers or less.

The spray 125 from nozzle 124 is directed through the vapor region between the two flames 122, whereby the water-binding, particulate-containing, flame-produced vapor is redirected in a direction toward the substrate 120. In this the water-binding material and proton-transfer material are co-deposited on the substrate.

Both the flame and the non-flame spray could be directed at the substrate to co-deposit the water-binding material and proton-transfer material; however, to reduce the deposition temperature at the flame surface, it is preferred that the flame or flames be directed at an angle oblique to the substrate surface and that the non-flame spray be used to direct the flame-produced vapor toward the substrate surface. Generally, it is desirable that the deposition temperature at the surface be 180° C. or below. The materials can be formed in the device of FIG. 1, or on a solid substrate from which the electrolyte layer can be removed.

Proton-conducting membranes 82 in accordance with the present invention may range in thickness from about 0.5 to about 1000 microns, preferably from about 10 to about 100 microns.

Figure 6:
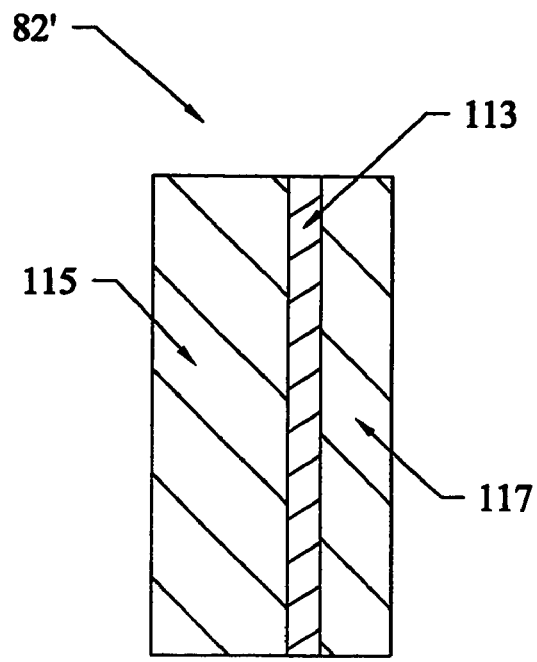
FIG. 6 is an enlarged cross-sectional view of a proton-conducting membrane having an intermediate thin film or layer for catalyzing conversion of conducting hydrogen and oxygen into water.

In accordance with an aspect of the present invention particularly useful with respect to hydrogen/oxygen PEFCs, a water-producing catalyst is incorporated into the proton-conducting membrane, either distributed throughout the proton-conducting membrane or, preferably, deposited as a distinct layer or film at an intermediate location within the proton-conducting membrane 82' as seen in FIG. 6. In PEFC cells, there inevitably occurs a minor amount of undesired conduction of oxygen and hydrogen (not as protons) through the membrane. This results in a minor loss of electrical potential at both electrodes. By incorporating a catalytic material, such as platinum in the proton-conducting membrane, diffusing oxygen and hydrogen gas are converted to water within the membrane. This avoids the loss of electrical potential at the electrodes. More importantly, however, the production of water within the membrane helps to maintain the desired level of hydration within the proton-conducting membrane even above 100° C. by constantly producing water from stray oxygen and hydrogen molecules.

While the catalyst, particularly platinum, may be distributed throughout the membrane, it is preferred that it be deposited as a layer 113 intermediate layers 115, 117 of proton-transfer material, such as Nafion® (persulfonated polytetrafluoroethylene) as shown in FIG. 6. Also, preferably, this layer is deposited closer to the cathode (oxygen) side than to the anode (hydrogen) side. This is because hydrogen, being a much smaller molecule than oxygen, has a greater conduction rate through the membrane. The location of the thin layer of catalyst can be placed at an optimal location within the membrane to account for the higher relative migration of hydrogen relative to oxygen. It is also within the scope of the invention to deposit catalytic material throughout the proton-transfer material and also provide a discrete film or layer of the catalytic material. The film or layer 113 of catalytic material is typically very thin, e.g., between about 10 and about 80 nanometers. It must be sufficiently porous to provide for proton-transfer therethrough.

The catalytic material, whether distributed throughout the proton-transfer material and/or as a discrete film or layer, may be used in conjunction with a water-binding material distributed throughout the proton-transfer material, as described above.

Figure 8:
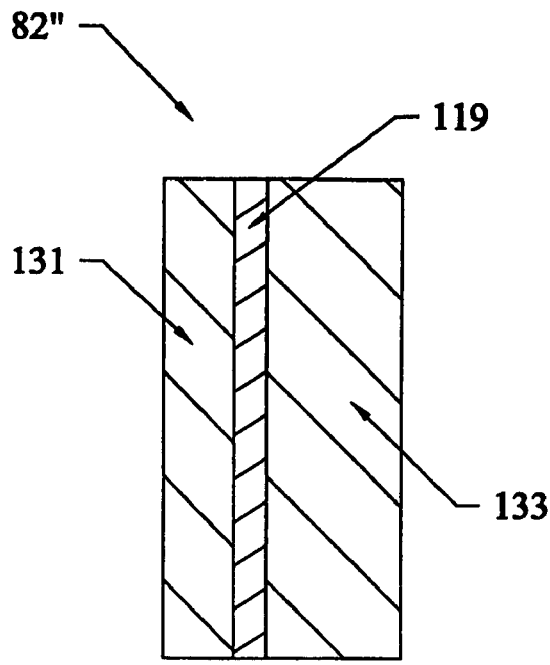
FIG. 8 is an enlarged cross-sectional view of a proton-conducting membrane having an intermediate thin film or layer.

FIG. 8 illustrates a proton-conducting membrane 82" for a DMFC in which an intermediate layer 119 is disposed between layers 131, 133 of proton-transfer material. In this case, the intermediate layer 119 is a material, such as zirconium phosphate, that blocks migration of methanol through the proton-conducting membrane 82". Methanol migration is a significant problem in DMFCs as methanol, which migrates even faster than water through the membrane, reduces efficiency of the cathode. By providing the methanol-blocking layer 119, this problem is reduced or eliminated. The methanol-blocking layer may be very thin, typically 1–100 nanometers in thickness, preferably 5–50 nanometers. It may be that the efficiency of the methanol-blocking membrane 119 is optimized when disposed closer to the anode than the cathode because the methanol migrates from the anode. Again, this aspect of the invention may optionally be used in conjunction with the embodiment of the invention in which a water-binding material is incorporated in the proton-transfer material.

When an intermediate layer 113 or 119 is formed for proton-conducting membranes 82' or 82", respectively, various orders of fabrication may be used. The membrane 113 or 119 may be deposited directly on a layer of proton-transfer material and a second layer of proton-transfer material subsequently deposited thereon. Such alternate deposition may be effected with the apparatus of FIG. 7 by alternately using the non-flame spray flame to deposit ionomer and using the flame, in conjunction with a re-direct spray, e.g., water, from the non-flame spray, to deposit the material of the intermediate layer 113 or 119. Alternatively, the intermediate layer 113 or 119 may be deposited on a material, such as a metal foil or a polytetrafluoroethylene (Teflon®) substrate and subsequently transferred to an ionomer layer (e.g., Nafion® (persulfonated polytetrafluoroethylene)) in a "decal transfer" technique. A subsequent layer of proton-transfer material would then be deposited on top of this layer. Optimally, the intermediate layer 113 or 119 are deposited with the methods and apparatus described with respect to FIGS. 1–3. In this case, after the ECL is deposited, the proton-exchange membrane (PEM) material is deposited to fill all existing permability of the layer. In such a system, the PEM (56) may be thinner or omitted and the two sides combined directly. The ECLs can be formed from one Tunnel (21) and the intermediate layer from another tunnel (21) in the correct sequence. Some amount of PEM can be formed between the ECL and the intermediate layer via another tunnel connection.

What is claimed is:

1. A method for depositing a catalytic layer on a surface of a substrate, the method comprising
    providing a continuous fluid streams that flows from upstream to downstream to impinge on said substrate,
    introducing particulates of support material into said fluid stream and, at a first upstream region of said fluid stream, depositing catalytic material on said support material particulates to produce particulates of supported catalytic material,
    in a second region of said fluid stream downstream of said first region, providing a spray comprising polymeric material so as to mix said polymeric material and said supported catalytic material, and
    impinging said fluid stream on said substrate surface so as to co-deposit said supported catalytic material particulates and said polymeric material on said substrate surface.

2. The method of claim 1 wherein said first region is at an elevated first temperature and said second region is at a second temperature lower than said first region.

3. The method of claim 2 wherein said catalytic material is produced in said first region by thermal reaction of material that is precursor to said catalytic material.

4. The method of claim 3 wherein said thermal reaction occurs in a flame.

5. The method of claim 1 wherein a quenching fluid is introduced into said gas stream downstream of said first region.

6. Apparatus for co-depositing catalytic material and polymeric material on a substrate, said apparatus comprising
    gas flow means for directing a stream of gas through a first upstream region, a second region downstream of said first region, and a deposition region downstream of said second region,
    means for locating a substrate in said deposition region such that the stream of gas impinges on said substrate,
    means for introducing particulates of support material into said fluid stream at or upstream of said first upstream region,
    means at said first upstream region for depositing catalytic material on said support material particulates to produce particulates of supported catalytic material,
    at said second region, means for providing a spray of polymeric material so as to mix said polymeric material and said supported catalytic material, and
    means to impinge said fluid stream on said substrate surface so as to co-deposit said supported catalytic material particulates and said polymeric material on said substrate surface.

7. Apparatus according to claim 6 wherein said deposition means at said first location comprises means to introduce a precursor of said catalytic material and means to heat said precursor to produce said catalytic material by thermal reaction.

8. Apparatus according to claim 6 wherein said heating means is a flame.

9. Apparatus according to claim 6 including quenching means to lower the temperature from said first region to said second region.

10. Apparatus according to claim 9 wherein said quenching means comprises means to introduce cooling fluid into said gas stream downstream of said first region.

* * * * *